(12) United States Patent
Wang et al.

(10) Patent No.: US 8,077,517 B2
(45) Date of Patent: Dec. 13, 2011

(54) DISTRIBUTED VDC FOR SRAM MEMORY

(75) Inventors: Li-Wen Wang, Taichung (TW);
Yen-Huei Chen, Hsin-Chu (TW);
Chen-Lin Yang, Hsin-Chu (TW);
Hsien-Yu Pan, Hsin-Chu (TW);
Shao-Yu Chou, Chu-Pei (TW);
Hung-Jen Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 153 days.

(21) Appl. No.: 12/338,732

(22) Filed: Dec. 18, 2008

(65) Prior Publication Data

US 2010/0157692 A1 Jun. 24, 2010

(51) Int. Cl.
*G11C 11/34* (2006.01)
(52) U.S. Cl. .............. 365/185.11; 365/154; 365/226; 365/230.03; 365/230.06; 365/189.09
(58) Field of Classification Search .......... 365/185.11, 365/154, 226, 230.03, 230.06, 189.09
See application file for complete search history.

(56) References Cited

U.S. PATENT DOCUMENTS

| 7,679,345 | B1 * | 3/2010 | Verma et al. | 323/273 |
| 7,746,047 | B2 * | 6/2010 | Yin et al. | 323/273 |
| 7,764,111 | B2 * | 7/2010 | Chiu et al. | 327/540 |
| 7,768,856 | B2 * | 8/2010 | Fook et al. | 365/211 |
| 2007/0121370 | A1 * | 5/2007 | Ellis et al. | 365/154 |
| 2008/0231240 | A1 * | 9/2008 | Parkes et al. | 322/28 |

FOREIGN PATENT DOCUMENTS

CN 1975926 A 6/2007

OTHER PUBLICATIONS

Chen, Y.H., et al., "A 0.6V 45nm Adaptive Dual-rail SRAM Compiler Circuit Design for Lower VDD_min VLSIs," 2008 Symposium on VLSI Circuits Digest of Technical Papers, 2 pgs., IEEE.

* cited by examiner

*Primary Examiner* — Fernando Hidalgo
(74) *Attorney, Agent, or Firm* — Slater & Matsil, L.L.P.

(57) ABSTRACT

An integrated circuit structure includes a memory. The memory includes a first memory macro and a second memory macro identical to the first memory macro. A first power block is connected to the first memory macro and is configured to provide a regulated voltage to the first memory macro. The first power block has a first input and a first output. A second power block substantially identical to the first power block is connected to the second memory macro and is configured to provide the regulated voltage to the second memory macro. The second power block has a second input and a second output. The first input and the second input are interconnected. The first output and the second output are interconnected.

10 Claims, 6 Drawing Sheets

DISTRIBUTED VDC FOR SRAM MEMORY

TECHNICAL FIELD

This invention relates generally to integrated circuits, and more particularly to memory design, and even more particularly to voltage-down converters (VDCs).

BACKGROUND

Static random access memory (SRAM) is commonly used in integrated circuits. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a bit into, or reading a bit from, the SRAM cell.

With the increasing down-scaling of integrated circuits, the operation voltages of integrated circuits are reduced, including the operation voltages of memory circuits. Accordingly, read and write margins of the SRAM cells, which are used to indicate how reliably the bits of the SRAM cells can be read from and written into, are reduced. Due to the existence of static noise, the reduced read and write margins may cause errors in the respective read and write operations.

Various approaches have been explored to lower VCCmin and to adjust for the ever-decreasing operation voltages. For example, dual-rail SRAM design uses a voltage regulator to provide a voltage, for example, higher than the operation voltage, to operate a memory. The regulated voltage is supplied to all of the macros in the memory. FIG. 1 illustrates a centralized scheme for supplying the regulated voltage (CVDD) to the memory. The memory, depending on its size, may have many macros including, for example, Macro1 through Macro8, as shown in FIG. 1. The voltage regulator may be placed at the center of the memory, and is connected to all of the macros through metal lines.

The centralized voltage supply scheme as shown in FIG. 1 suffers from drawbacks. First, the metal lines connected to the voltage regulator have voltage drops that can be represented as IR, wherein I is the current in the metal lines, and R is the line resistance, and the longer the metal lines are, the greater the voltage IR will be. Accordingly, the macros (such as macros Macro2, Macro3, Macro6, and Macro7) that are closer to the voltage regulator receive higher voltages (CVDD-$I_1R_1$) than the voltages (CVDD-$I_1R_1$-$I_2R_2$) received by the macros (such as macros Macro1, Macro4, Macro5, and Macro8) that are farther away from the voltage regulator. Second, with metal lines closer to the voltage regulator carrying higher currents than the metal lines farther away from the voltage regulator, current crowding may occur in the metal lines closer to the voltage regulator, and the Joule heating caused by the currents further results in an uneven temperature distribution. In addition, the centralized voltage regulator needs a customized compensation circuit to adjust its AC response. Since the required compensation circuit depends on the load size (the size of the memory), for each memory design, the respective compensation circuit has to be redesigned and tested.

Accordingly, what is needed in the art is a solution that may provide regulated voltages suited for the ever-decreasing operation voltages while at the same time overcoming the deficiencies of the prior art. In addition, the requirement for reducing VCCmin also needs to be addressed.

SUMMARY OF THE INVENTION

In accordance with one aspect of the present invention, an integrated circuit structure includes a memory. The memory includes a first memory macro and a second memory macro identical to the first memory macro. A first power block is connected to the first memory macro and configured to provide a regulated voltage to the first memory macro. The first power block has a first input and a first output. A second power block substantially identical to the first power block is connected to the second memory macro and configured to provide the regulated voltage to the second memory macro. The second power block has a second input and a second output. The first input and the second input are interconnected. The first output and the second output are interconnected.

In accordance with another aspect of the present invention, a memory includes a memory macro; and a power block connected to the memory macro and configured to provide a regulated voltage to the memory macro. The power block includes a first input, and a first output for outputting the regulated voltage. The memory further includes a main block including a reference generator configured to generate a reference voltage; and an operational amplifier. The operational amplifier includes a first input receiving the reference voltage; a second input coupled to the first output of the power block; and an output coupled to the first input of the power block.

In accordance with yet another aspect of the present invention, a family of chips includes a first chip including a first memory having a first size, and a second chip including a second memory having a second size different from the first size. The first memory includes a first power-macro pair including a first memory macro; and a first power block connected to the first memory macro and configured to provide a first regulated voltage to the first memory macro. The first power block has a first input, and a first output outputting the first regulated voltage. The first memory further includes a first main block connected to the first power block. The first main block includes a first plurality of compensation modules identical to each other, wherein the first size of the first memory and a number of all compensation modules in the first main block have a first ratio. The second memory includes a second power-macro pair including a second memory macro; and a second power block connected to the second memory macro and configured to provide a second regulated voltage to the second memory macro. The second power block has a second input and a second output outputting the second regulated voltage. The second memory further includes a second main block connected to the second power block. The second main block includes a second plurality of compensation modules with each being identical to any of the first plurality of compensation modules, wherein the second size of the second memory and a number of all compensation modules in the second main block have a second ratio substantially equal to the first ratio.

The advantageous features of the present invention include more uniform regulated voltage, reduced current crowding, reduced unevenness in temperatures, and modularized design for the easy expansion of memory.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel voltage down converter (VDC) embodiment is provided. The variations and operation of the embodiment of the present invention are discussed. Throughout the various views and illustrative embodiments of the present invention, like reference numbers are used to designate like elements. Throughout the description, a VDC may be used to provide voltages either higher or lower than the corresponding operation voltage VDD, and operation voltage VDD may be the same voltage used by the core circuit, although they can also be different.

Figure 1:
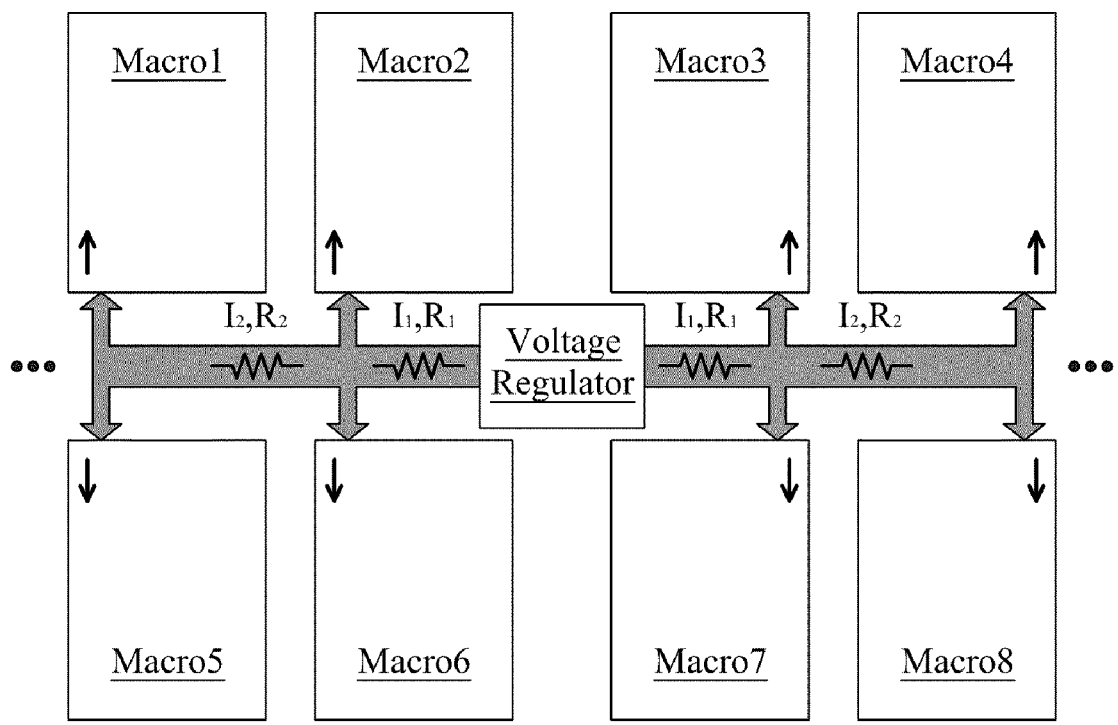
FIG. 1 illustrates a conventional centralized scheme for providing regulated voltages to a memory having multiple macros.
Figure 2:
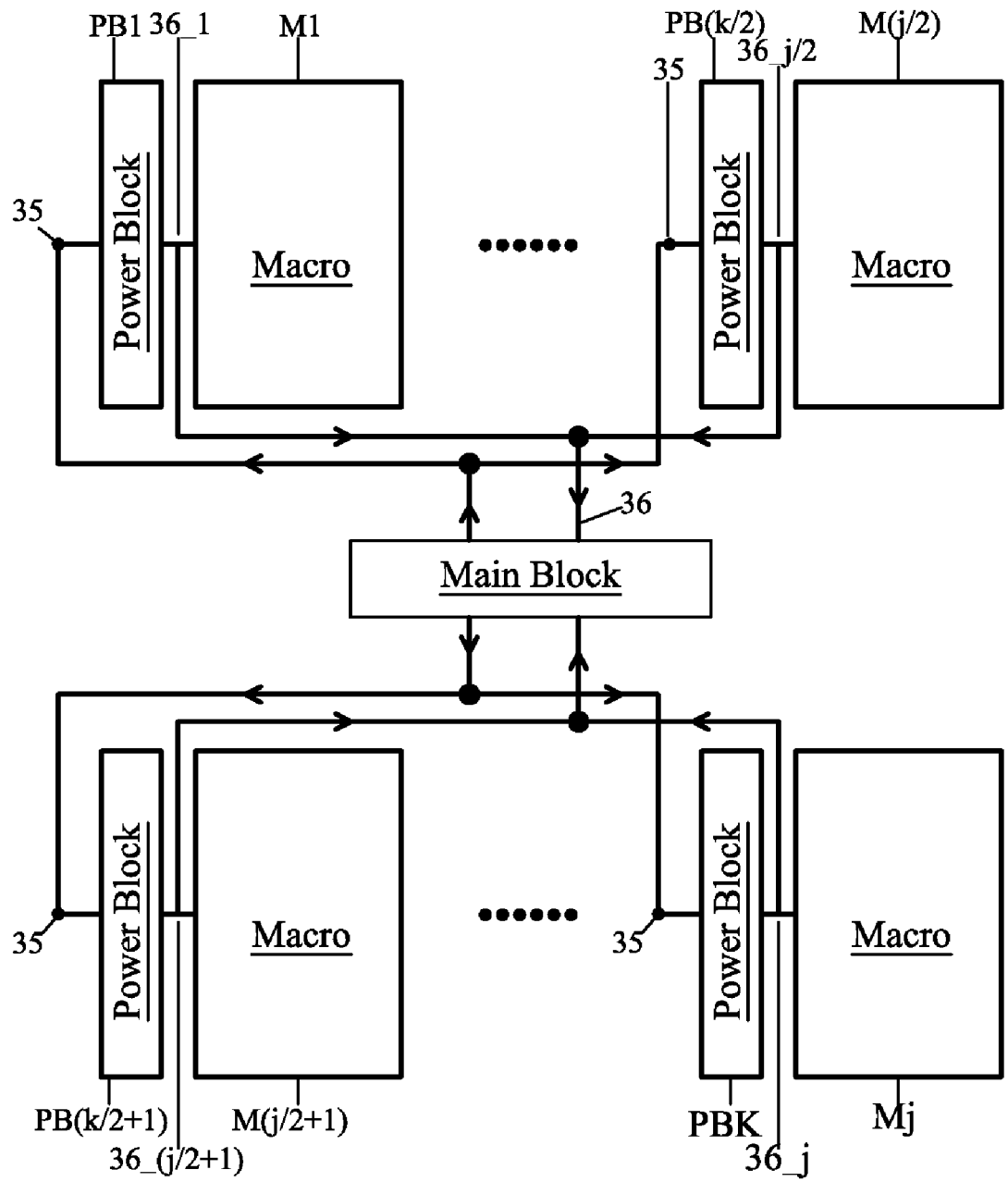
FIG. 2 shows a block diagram of a distributed voltage down converter (VDC) and a memory receiving regulated voltages from the VDC.

FIG. 2 illustrates a portion of a memory, which includes a plurality of macros M (denoted as macros M1 through Mj), wherein integer j is the count of all of the macros in the memory, and may be 2, 4, . . . 256, 512, 1024, or the like. Each of the macros is formed of a plurality of, for example, 1M, 2M, 4M, or the like, memory cells. A distributed VDC is configured to provide a regulated voltage (referred to as converted VDD (CVDD) hereinafter) to the memory for its operation, wherein the regulated voltage CVDD is different from operation voltage VDD.

The distributed VDC includes a main block and a plurality of power blocks PB (denoted as power blocks PB1 through PBk), wherein integer k is the count of all power blocks in the memory, and may be 2, 4, . . . 256, 512, 1024, or the like. In an embodiment, as shown in FIG. 2, each of the macros M1 through Mk needs to supply regulated voltage CVDD to one of the macros M1 through Mj, and hence integer j is equal to integer k. In alternative embodiments, each of the power blocks PB1 through PBk needs to supply regulated voltage CVDD to more than one of the macros M1 through Mj, and hence integer k is a fraction of integer j. The main block controls the operation of power blocks PB1 through PBk, so that the regulated voltages CVDD received by macros M1 through Mj are uniform and accurate. Power blocks PB1 through PBk, on the other hand, feed back error information to the main block, so that any variation in the regulated voltage CVDD may be compensated for. The details of the operation of the distributed VDC are discussed in subsequent paragraphs.

Figure 3:
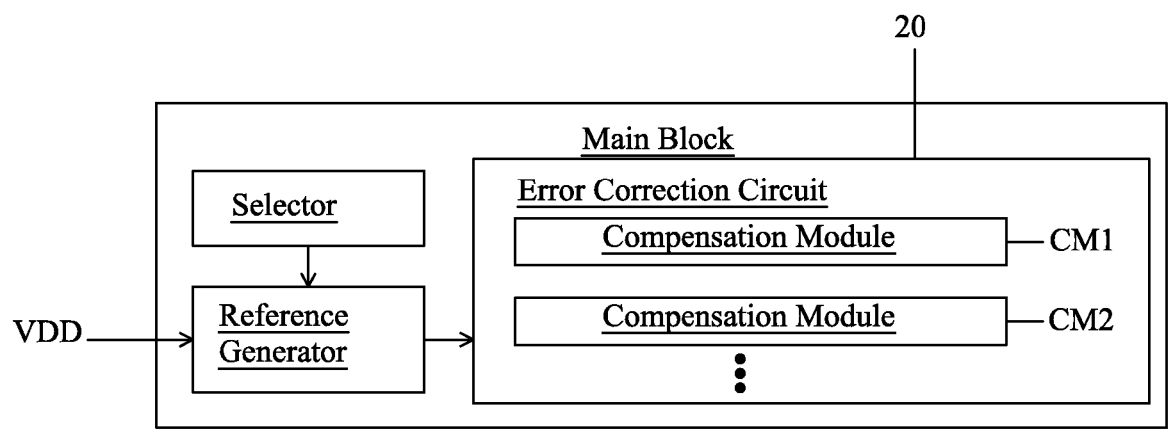
FIG. 3 shows a block diagram of a main block for providing a reference voltage.

FIG. 3 schematically illustrates a block diagram of the main block. The VDC may need to adjust the level of the regulated voltage CVDD. For example, if the operation voltage is 1.2V, the VDC may need to be able to provide three regulated voltages CVDD having the magnitudes of 1.5V, 1.6V, and 1V, which are needed by the memory for different operations and/or different purposes. The main block of the VDC thus includes a selector, which is configured to determine a voltage CVDD that the VDC will provide. When a regulated voltage CVDD is determined, the selector informs a reference generator to generate a reference voltage CVDD', which is used by power blocks PB as a reference, so that each of the power blocks PB1 through PBk may generate one regulated voltage CVDD accurately matching (equal to) the reference voltage CVDD'. The reference voltage CVDD' needs to be accurate enough, so that the accuracy of the regulated voltage CVDD generated by power blocks PB can be guaranteed. Further, the reference voltage CVDD' needs to be substantially free from the effect of the process, voltage, and temperature variations.

Figure 4:
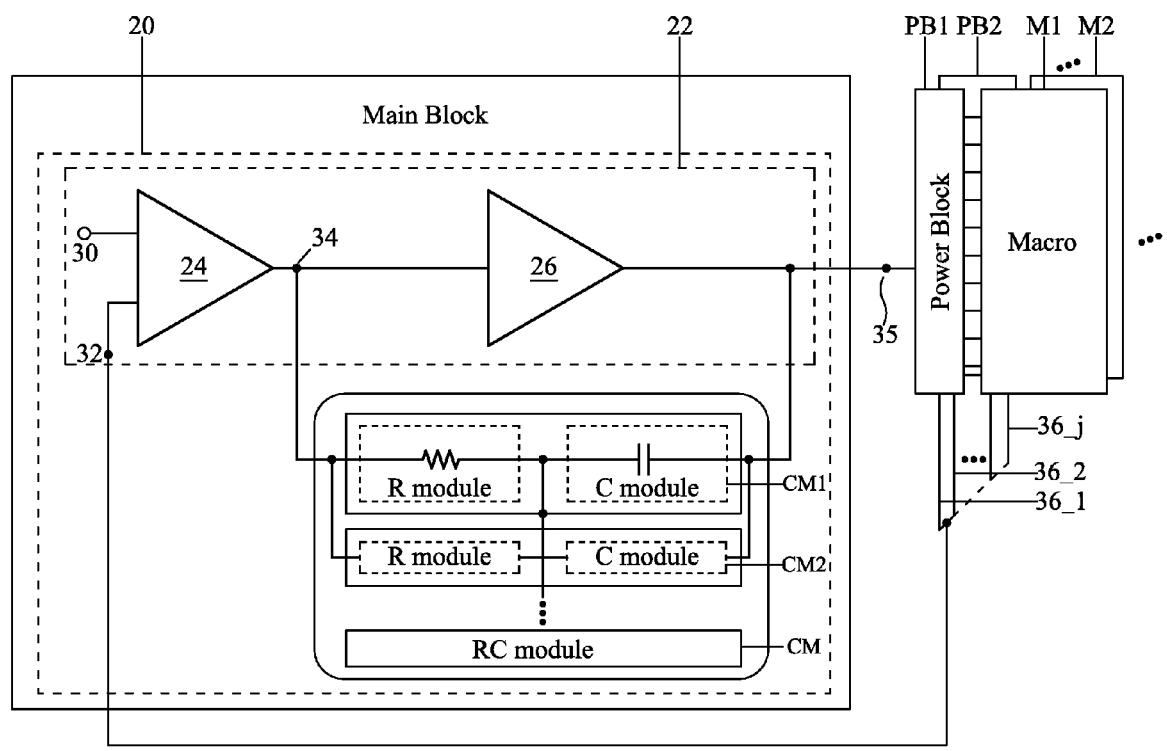
FIG. 4 illustrates connections between a main block and power blocks of the VDC.

After the reference voltage CVDD' is generated, it is provided to error correction circuit 20, which interacts with power blocks PB to generate regulated voltages CVDD that match the reference voltage CVDD' as much as possible. The interaction between error correction circuit 20 and power blocks PB is schematically illustrated in FIG. 4. In an exemplary embodiment, error correction circuit 20 includes core amplification circuit 22, which further includes operational amplifier 24, and possibly operational amplifier 26. Operational amplifier 24 has inputs 30 and 32. Input 30 is connected to the reference voltage CVDD'. Input 32 is connected to the outputs of power blocks PB1 through PBk. The output of amplifier 24 is further coupled to the inputs 35 of power blocks PB1 through PBk, possibly through other circuits such as operational amplifier 26. Therefore, an error correction loop is formed. The error correction loop is also illustrated in FIG. 2 using arrows forming a loop.

Referring back to FIG. 2, in the preferred embodiment, power blocks PB1 through PBk are identical to each other, and their loads (macros) M1 through Mj are also identical to each other. It can thus be assumed that with the same input voltage (at inputs 35) provided to all inputs of power blocks PB, the output voltages generated at nodes 36 (also denoted as 36_1 through 36_j) of power blocks PB1 through PBk will be identical, or at least substantially identical. The outputs 36_1 through 36_k of the respective power blocks PB1 through PBk thus may be interconnected, as shown in FIGS. 2 and 4. Referring again to FIG. 4, assuming the voltage at outputs 36_1 through 36_j is higher than reference voltage CVDD', the voltage at node 32 (used as an error message) will thus be higher than the reference voltage CVDD' at node 30, and operational amplifier 24 will generate an output voltage to drive power blocks PB1 through PBk to reduce their output voltage CVDD. Conversely, if the voltage at outputs 36_1 through 36_j is lower than reference voltage CVDD', the voltage at node 32 will be lower than the reference voltage CVDD' at node 30, and operational amplifier 24 will output an output voltage to drive up power blocks PB1 through PBk to increase their voltage CVDD. Therefore, the error correction loop may maintain an accurate regulated voltage CVDD that is substantially equal to the reference voltage CVDD'. It is realized that if the level of reference voltage CVDD' is adjusted by the selector in FIG. 3, the regulated voltage CVDD generated by power blocks PB1 through PBk also changes to match the newly generated reference voltage CVDD'.

Advantageously, since the main block only provides a reference voltage CVDD' to control power blocks PB1 through PBk, but not the high currents required by the macros, the current in the metal lines interconnecting the main block and power blocks PB can be very small. The voltage drop IR from the main block to even the farthest macro is thus small, wherein I is the current in a metal line, and R is the resistance of the metal line. Further, there will be no overheating in the main block and no uneven temperature distribution in the metal lines. In addition, as shown in FIG. 5, since a power block is located close to the respective macro, it is possible to have a plurality of metal lines connecting the power block to the respective macro, while it is not feasible to do so in a centralized VDC design.

Figure 5:
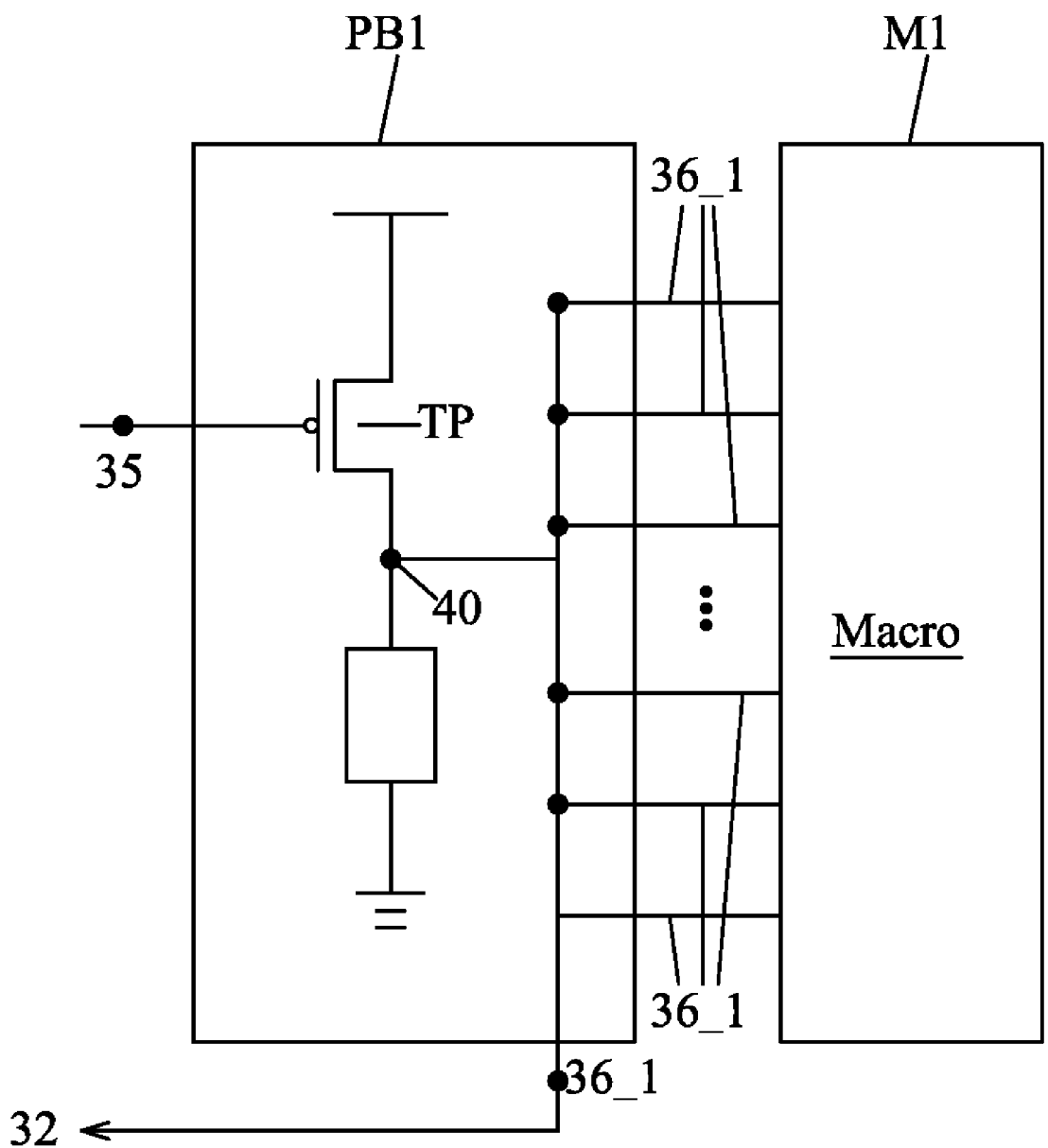
FIG. 5 illustrates an exemplary circuit diagram of a power block and the connection between the power circuit and a respective macro.

FIG. 5 illustrates a connection between a power block PB and the respective macros M. For simplicity, power block PB1 and the respective macro M1 are used as an example. The teaching regarding power block PB1 and macro M1, however, can also be applied to other power blocks and macros. In an exemplary embodiment, power block PB1 includes PMOS transistor TP, which has a gate connected to input 35 of power block PB1. Drain 40 of PMOS transistor TP may be connected (or coupled) to output 36_1 of power block PB1. Output 36_1 of power block PB1 is connected to input 32 of operational amplifier 24 (not shown in FIG. 5, please refer to FIG. 4). Accordingly, node 32 has a same voltage as the regulated voltage provided to macro M1. It is noted that if the voltage at input 35 (which receives an output from error correction circuit 20, FIG. 4) increases, the voltage at node 40/36_1 decreases, and vice versa, and hence power block PB1 generates an appropriate output voltage in response to the input voltage. If power block PB1 has to support a macro with a greater number of memory cells, the size of power block PB1 may be increased. For example, a plurality of PMOS transistors similar to PMOS transistor TP may be interconnected gate to gate, drain to drain, and source to source, so that a greater current can be provided by power block PB1. One skilled in the art will realize that the function of power circuit PB1 may be implemented with different circuits other than PMOS transistor TP, and may include more devices.

Referring to FIG. 5, it is appreciated that the output voltage at node 40 may be a function of the load (the number of memory cells in macro M1). With a greater load, the voltage at node 40 may decrease, while with a smaller load, the voltage at node 40 may increase. However, with the above-discussed error correction loop, the output voltage may be corrected if variations occur.

Advantageously, in the embodiments of the present invention, it is possible to implement a modularized compensation circuit, as is schematically illustrated in FIG. 4 (for example between nodes 34 and 35). It is realized that in order to compensate for the AC response of the main circuit and to eliminate the undesirable oscillation in the main circuit, operational amplifiers 24 and 26 require compensation circuits. The design of the compensation circuits is related to the size of the memory the main block supports. Conventionally, if the size of a conventional voltage regulator is changed from one design to the other, the corresponding compensation circuit has to be redesigned. In the embodiments of the present invention, however, the compensation circuits may be modularized, with one or more identical compensation modules (CMs) used in each memory. Each of the compensation modules may include a resistor module and a capacitor module, as shown in FIG. 4. In an exemplary embodiment, the resistor module may include one or more resistors, and the capacitor module may include one or more capacitors.

Figure 6:
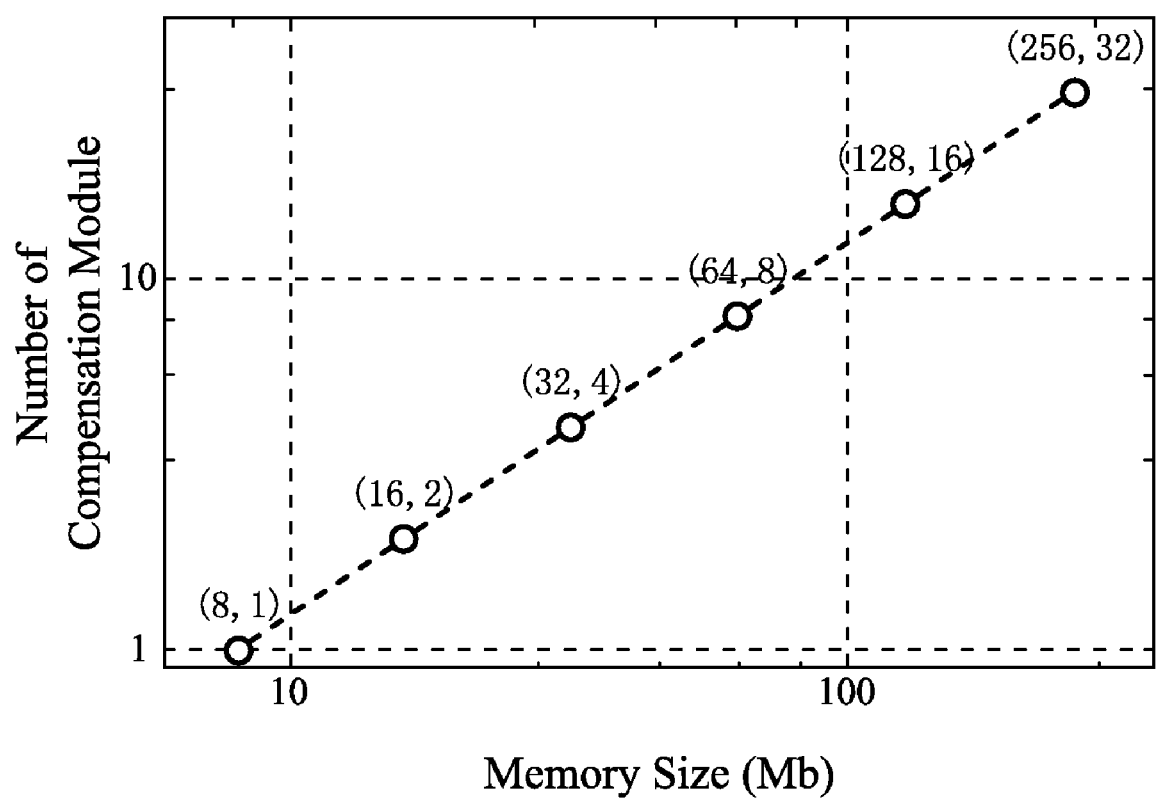
FIG. 6 illustrates a relationship between the size of a memory and the required number of compensation modules.

FIG. 6 illustrates an example indicating the relationship between the size of the memory (X-axis) and the required number of compensation modules (Y-axis). In each of the illustrated points, the first symbol in the parenthesis represents the number of macros in a memory, while the second number represents the required number of compensation modules in the memory. The point (8, 1) means that a memory having eight macros requires 1 compensation module in the error correction circuit, as shown in FIG. 4. If the number of macros in the memory is to be increased to 16, two compensation modules would be needed, as shown by point (16, 2). Further increases in the number of macros (hence the size of the memory) results in an increase of the required number of compensation modules, as shown by points (32, 4), (64, 8), (128, 16), (256, 32), and so on. Advantageously, with the modularized compensation circuit design, if a memory design needs to be modified to increase the size of a memory, the design of the main block may be simply modified by adding more compensation modules identical to the existing compensation module(s), with substantially no change to other parts of the main block such as error correction circuit 20 (refer to FIG. 3). This significantly reduces the design and testing time for designing the main block.

The concept of modularized compensation modules is particularly beneficial to the design of a chip family, including, for example, a series of chips being similar in their applications and designs, but having different memory sizes. By using the concept of the modularized compensation modules, from chip to chip (with different memory sizes) in the chip family, the ratio of the memory size (either the total number of macros, or the total number of memory cells) to the count of compensation modules remains substantially the same from chip to chip. Further, the error correction circuits may have substantially the same design except the number of compensation modules. In addition, the concept of the distributed VDC may be applied to the chip family, so that the memory of chips may be expanded by adding more pairs of power blocks and macros (referred to as power-macro pair hereinafter). Clearly, assuming that in different chips in the same chip family, the macros and power blocks are all identical, and the count of all power-macro pairs to the count of all compensation modules in a chip should be equal to, or substantially equal to, that in other chips.

The concept of modularized compensation modules and distributed VDC may also be applied to different memories in a same chip, wherein the expansion from one memory to another memory in a same chip may be performed by adding more compensation modules and more power-macro pairs.

The embodiments of the present invention have several advantageous features. By adopting a distributed design of VDC, the problems experienced in the centralized regulator design, such as excess and uneven voltage drops, uneven temperature distribution, and current crowding, are substantially eliminated, and more accurate regulated voltages can be provided. By adopting the modularized compensation circuit design and distributed design of VDC, memory expansion takes significantly less design effort.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
a memory comprising:
a first memory macro;
a first power block connected to the first memory macro and configured to provide a regulated voltage to the first memory macro, the first power block comprising a first input and a first output;
a second memory macro identical to the first memory macro;
a second power block substantially identical to the first power block, wherein the second power block is connected to the second memory macro and is configured to provide the regulated voltage to the second memory macro, and wherein the second power block comprises a second input and a second output; and
a control block comprising:
a first compensation module configured to stabilize an output voltage for a first group of memory macros which include the first memory macro; and
a second compensation module configured to stabilize an output voltage for a second group of memory macros which include the second memory macro.

2. The integrated circuit structure of claim 1, wherein the first input is connected to the second input, and the first output is connected to the second output.

3. The integrated circuit structure of claim 1 further comprising a main block comprising:
a reference generator configured to generate a reference voltage;
a first node for receiving the reference voltage;
a second node coupled to the first output and the second output; and
a comparison circuit coupled to the first node and the second node and configured to compare a voltage on the first output and the second output to the reference voltage, and to output a comparison result to the first input and the second input.

4. The integrated circuit structure of claim 3, wherein the comparison circuit comprises a first operational amplifier with a first input coupled to the first node and a second input coupled to the second node.

5. The integrated circuit structure of claim 4 further comprising:
a second operational amplifier coupling the first operational amplifier to the first power block and the second power block;
a first compensation module coupling an output of the first operational amplifier to an output of the second operational amplifier; and
a second compensation module identical to the first compensation module coupling the output of the first operational amplifier to the output of the second operational amplifier.

6. The integrated circuit structure of claim 3, wherein the main block further comprises a selector configured to control the reference generator to adjust the reference voltage.

7. The integrated circuit structure of claim 3, wherein the first power block and the second power block are configured to generate the regulated voltage matching the reference voltage, and to supply the regulated voltage to the first memory macro and the second memory macro, respectively.

8. The integrated circuit structure of claim 3, wherein the main block, the first power block, and the second power block are configured to provide a first regulated voltage to the first memory macro and the second memory macro at a first time, and to provide a second regulated voltage different from the first regulated voltage to the first memory macro and the second memory macro at a second time.

9. The integrated circuit structure of claim 1, wherein the first power block provides a voltage and a current to only the first memory macro, and the second power block provides the voltage and additional currents to only the second memory macro.

10. The integrated circuit structure of claim 1 further comprising:
a main block comprising:
a reference generator configured to generate a reference voltage; and
a first operational amplifier comprising:
a first input for receiving the reference voltage;
a second input coupled to the first output of the first power block; and
an output coupled to the first input of the first power block a plurality of compensation modules.

* * * * *